(12) United States Patent
Aghoram et al.

(10) Patent No.: US 11,869,986 B2
(45) Date of Patent: Jan. 9, 2024

(54) VERTICAL DEEP TRENCH AND DEEP TRENCH ISLAND BASED DEEP N-TYPE WELL DIODE AND DIODE TRIGGERED PROTECTION DEVICE

(71) Applicant: Texas Instruments Incorporated, Dallas, TX (US)

(72) Inventors: Umamaheswari Aghoram, Richardson, TX (US); Akram Ali Salman, Plano, TX (US); Binghua Hu, Plano, TX (US); Alexei Sadovnikov, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/459,991

(22) Filed: Aug. 27, 2021

(65) Prior Publication Data
US 2023/0066563 A1    Mar. 2, 2023

(51) Int. Cl.
*H01L 29/866* (2006.01)
*H01L 27/02* (2006.01)
*H01L 29/66* (2006.01)

(52) U.S. Cl.
CPC ........ *H01L 29/866* (2013.01); *H01L 27/0255* (2013.01); *H01L 29/66106* (2013.01); *H01L 27/0259* (2013.01)

(58) Field of Classification Search
CPC . H01L 29/861; H01L 29/8613; H01L 29/866; H01L 29/8725; H01L 29/66106; H01L 29/66128; H01L 29/66234; H01L 29/6625; H01L 29/66204; H01L 27/0259; H01L 21/02694; H01L 21/0415; H01L 21/0455; H01L 21/046–047; H01L 21/2253; H01L 21/265–266; H01L 29/0646; H01L 21/3065; H01L 21/465;
(Continued)

(56) References Cited

U.S. PATENT DOCUMENTS

| | | | |
|---|---|---|---|
| 4,099,998 A | 7/1978 | Ferro et al. | |
| 5,602,046 A | 2/1997 | Calafut et al. | |
| 5,831,312 A | 11/1998 | Wen | |
| 5,998,837 A | 12/1999 | Williams | |
| 6,586,317 B1 | 7/2003 | Vashchenko et al. | |
| 6,884,683 B2 | 4/2005 | Hshieh et al. | |
| 8,492,866 B1 | 7/2013 | Anderson et al. | |
| 8,637,952 B2 | 1/2014 | Yamaura | |

(Continued)

FOREIGN PATENT DOCUMENTS

| | | |
|---|---|---|
| CN | 112768355 A | 5/2021 |
| DE | 10311059 A1 | 10/2004 |

OTHER PUBLICATIONS

International Search Report from the PCT International Searching Authority, PCT/US2022/041830, dated Nov. 30, 2022.

*Primary Examiner* — Natalia A Gondarenko
(74) *Attorney, Agent, or Firm* — Yudong Kim; Frank D. Cimino

(57) ABSTRACT

A semiconductor device which includes two or more integrated deep trench features configured as a Zener diode. The Zener diode includes a plurality of deep trenches extending into semiconductor material of the substrate and a dielectric deep trench liner that includes a dielectric material. The deep trench further includes a doped sheath contacting the deep trench liner and an electrically conductive deep trench filler material within the deep trench. The doped sheath of adjacent deep trenches overlap and form a region of higher doping concentration which sets the breakdown voltage of the Zener diode. The Zener diode can be used as a triggering diode to limit the voltage on other components in a semiconductor device.

21 Claims, 12 Drawing Sheets

(58) Field of Classification Search
CPC .............. H01L 21/47573; H01L 21/461; H01L 21/467; H01L 21/482; H01L 21/4832; H01L 21/31055; H01L 21/31116; H01L 21/67069; H01L 27/02; H01L 27/0255; H01L 27/0262; H01L 27/0296; H01L 29/868; H01L 29/872; H01L 29/0649; H01L 29/0692; H01L 29/0688; H01L 29/6606; H01L 29/66068; H01L 29/66098; H01L 29/66121; H01L 29/882; H01L 29/885; H01L 29/66136; H01L 29/66143; H01L 29/87; H01L 29/66151; H01L 29/66219; H01L 29/66363; H01L 29/66371; H01L 29/66386; H01L 29/66393; H01L 29/66413; H01L 29/66212; H01L 27/0248; H01L 27/0292; H01L 27/0811; H01L 27/0814; H01L 27/0817; H01L 27/1463

USPC ....... 257/603, 619, 620, 623, 622, 625, 618, 257/332, 355, 328, 143, 146, 491, 29.007, 257/29.003, 21.352

See application file for complete search history.

(56) References Cited

U.S. PATENT DOCUMENTS

| | | | |
|---|---|---|---|
| 2011/0175199 A1* | 7/2011 | Lin ..................... | H01L 29/0646 257/605 |
| 2014/0027773 A1* | 1/2014 | Meyer ................. | H01L 29/0646 257/E29.007 |
| 2014/0061715 A1 | 3/2014 | Chen et al. | |
| 2018/0247925 A1* | 8/2018 | Salman ................ | H01L 27/0255 |
| 2019/0103498 A1* | 4/2019 | Pang ........................ | H01L 29/36 |
| 2020/0403104 A1* | 12/2020 | Hamazawa ............. | H01L 24/45 |

* cited by examiner

VERTICAL DEEP TRENCH AND DEEP TRENCH ISLAND BASED DEEP N-TYPE WELL DIODE AND DIODE TRIGGERED PROTECTION DEVICE

FIELD

This disclosure relates to the field of semiconductor devices. More particularly, but not exclusively, this disclosure relates to manufacture and use of deep trenches as diodes and Zener diode triggered protection devices.

BACKGROUND

Zener diodes are used in semiconductor in applications where a reliable breakdown for current flow is needed. As geometries shrink in semiconductor devices current techniques either generally require an extra photolithography step and implant or increased area to realize such devices. Improvements in integrating Zener triggered deep trench diodes into semiconductor device process flows are needed.

SUMMARY

The present disclosure introduces a semiconductor device including an integrated deep trench diode in a substrate of the semiconductor device as a key element of a Zener diode. The deep trench diode includes two or more deep trenches extending into the substrate. The deep trench diode includes a deep trench dielectric layer that includes a silicon dioxide compound. The deep trench diode further includes an electrically conductive deep trench filler material on the deep trench dielectric layer in the deep trenches. The deep trench diode is surrounded by a deep n-well sheath which conducts current above the Zener diode breakdown voltage. The deep trench diode breakdown voltage is controlled by the concentration of deep n-well dopant in the region between neighboring deep trenches.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

In this disclosure and the claims that follow, unless stated otherwise and/or specified to the contrary, any one or more of the layers set forth herein can be formed in any number of suitable ways, such as with spin-on techniques, sputtering techniques (e.g., Magnetron and/or ion beam sputtering), (thermal) growth techniques or deposition techniques such as chemical vapor deposition (CVD), physical vapor deposition (PVD), plasma enhanced chemical vapor deposition (PECVD), or atomic layer deposition (ALD), for example. As another example, silicon nitride may be a silicon-rich silicon nitride or an oxygen-rich silicon nitride.

It is noted that terms such as top, bottom, over, under, and side may be used in this disclosure. These terms should not be construed as limiting the position or orientation of a structure or element, but should be used to provide spatial relationship between structures or elements. Similarly, the term "outward" would refer to directions away from the device or area or designated parts thereof.

Figure 1A:
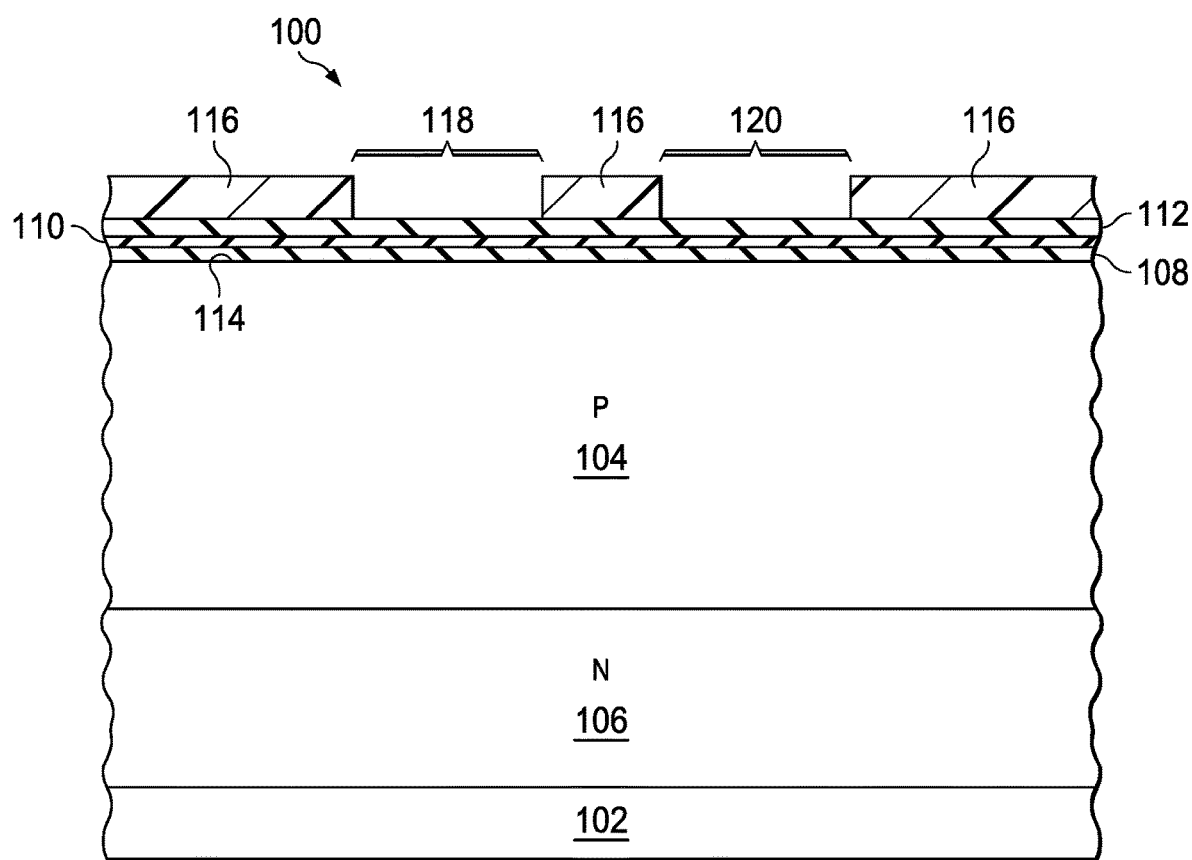
FIG. 1A through FIG. 1M are cross sections of the steps in the formation of a deep trench Zener diode.

In FIG. 1A through FIG. 1M, a method of forming a semiconductor device 100 under a sequence of steps that forms a Zener diode which contains deep trench structures is shown. Referring to FIG. 1A, the semiconductor device 100 can be a discrete component device (e.g., a single transistor) or an integrated circuit having multiple devices. FIG. 1A shows a semiconductor device 100 at the point in the process flow where a semiconductor layer 104 of a lightly doped p-type has been grown on a substrate 102, and a portion of the semiconductor layer 104 has been processed, e.g. by dopant implantation, to form an n-type buried layer (NBL) 106 under the semiconductor layer 104. The NBL layer 106 typically has an average dopant density greater than twice an average dopant density of the semiconductor layer 104 between the buried layer and a top surface of the substrate.

After the NBL layer 106 has been defined, a pad oxide layer 108, a silicon nitride cap layer 110 and a hard mask layer 112 may be sequentially formed on a top surface 114 of the semiconductor layer 104. The pad oxide layer 108 serves the function of stress relief between the semiconductor layer 104 and subsequent layers, and it may include silicon dioxide that is formed by a thermal oxidation process or a chemical vapor deposition process. The silicon nitride cap layer 110 serves the function of exclusionary film allowing selective oxidation, and it may include silicon nitride (e.g., $Si_3N_4$ that is deposited under a low-pressure chemical vapor deposition (LPCVD) furnace process). The hard mask layer 112 serves the function of a hard mask during the deep trench etch process 122 and the hard mask layer 112 may include a silicon dioxide that is deposited under a plasma enhanced chemical vapor deposition (PECVD) process. A photoresist mask 116 is deposited and patterned with an opening exposing a first deep trench 118 and a second deep trench 120 of the semiconductor layer 104. The photoresist mask 116 serves the function of masking the hard mask layer 112 and it may include a light sensitive organic material that is coated, exposed and developed.

Figure 1B:
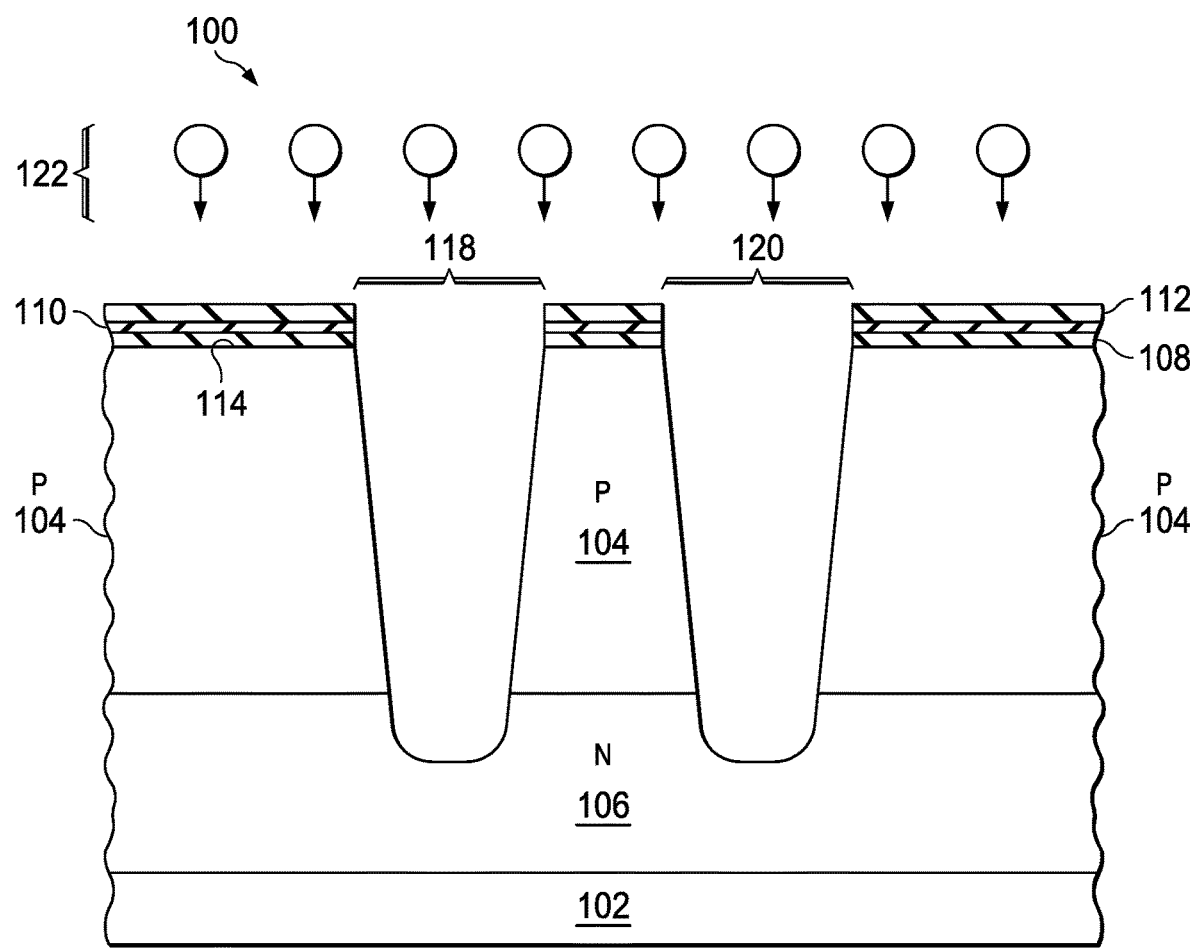

In FIG. 1B, a deep trench etch process 122 forms two or more deep trenches resulting in a first deep trench 118 and a second deep trench 120. A deep trench in the microelectronic device 100 is any trench which has a depth greater than twice the depth of the shallow trench isolation (STI) 150 of the microelectronic device 100. The deep trench etch process 122 may include multiple sequences. In one implementation for example, a hard mask etch may be first performed to remove the hard mask layer 112 exposed by the photoresist mask 116, and a multi-step etch may then be performed to remove the silicon nitride cap layer 110, the pad oxide layer 108, and the semiconductor layer 104 that are exposed by the hard mask layer 112. During the multi-step etch, the photoresist mask 116 is also removed, leaving the hard mask layer 112 to prevent the area outside of the first deep trench 118 and the second deep trench 120 from being etched.

Figure 1C:
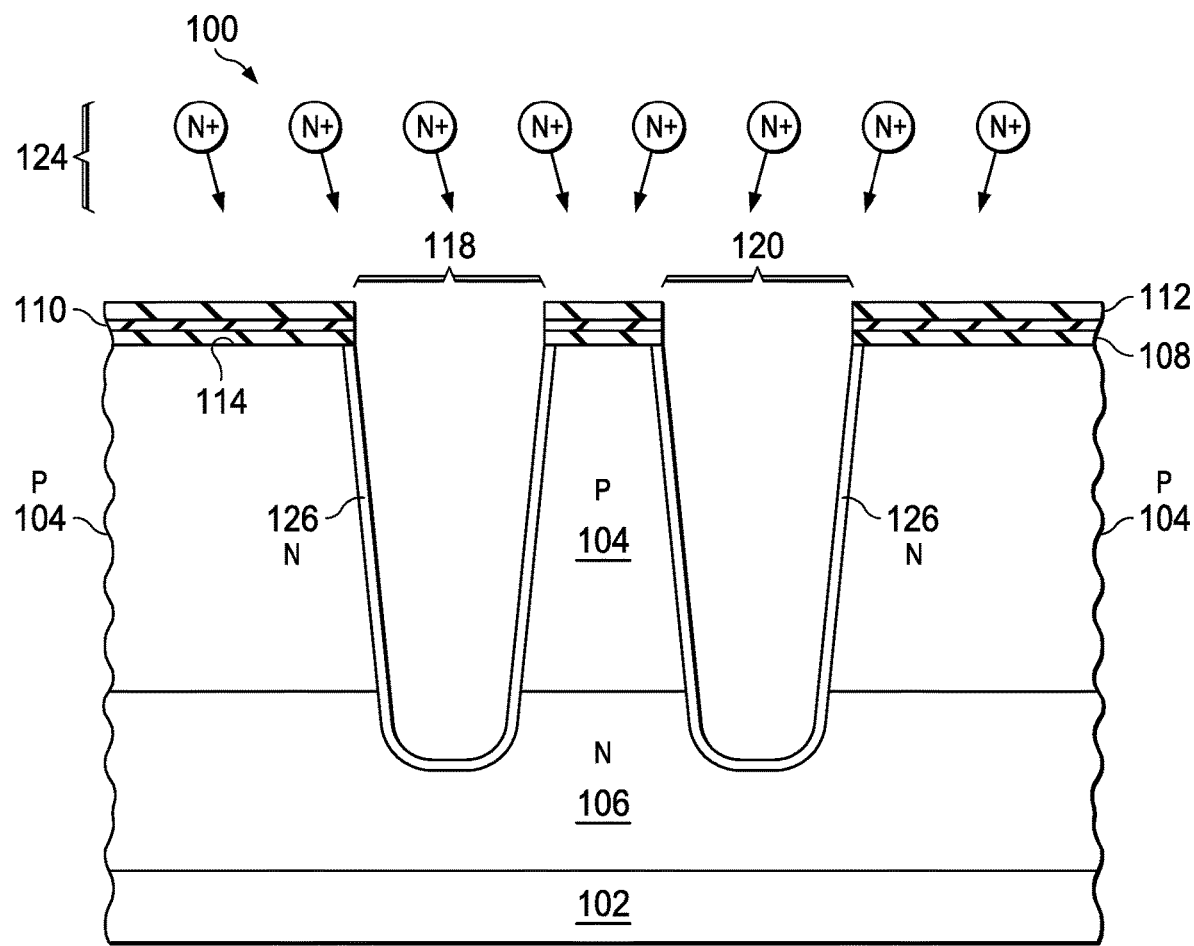
Figure 1D:
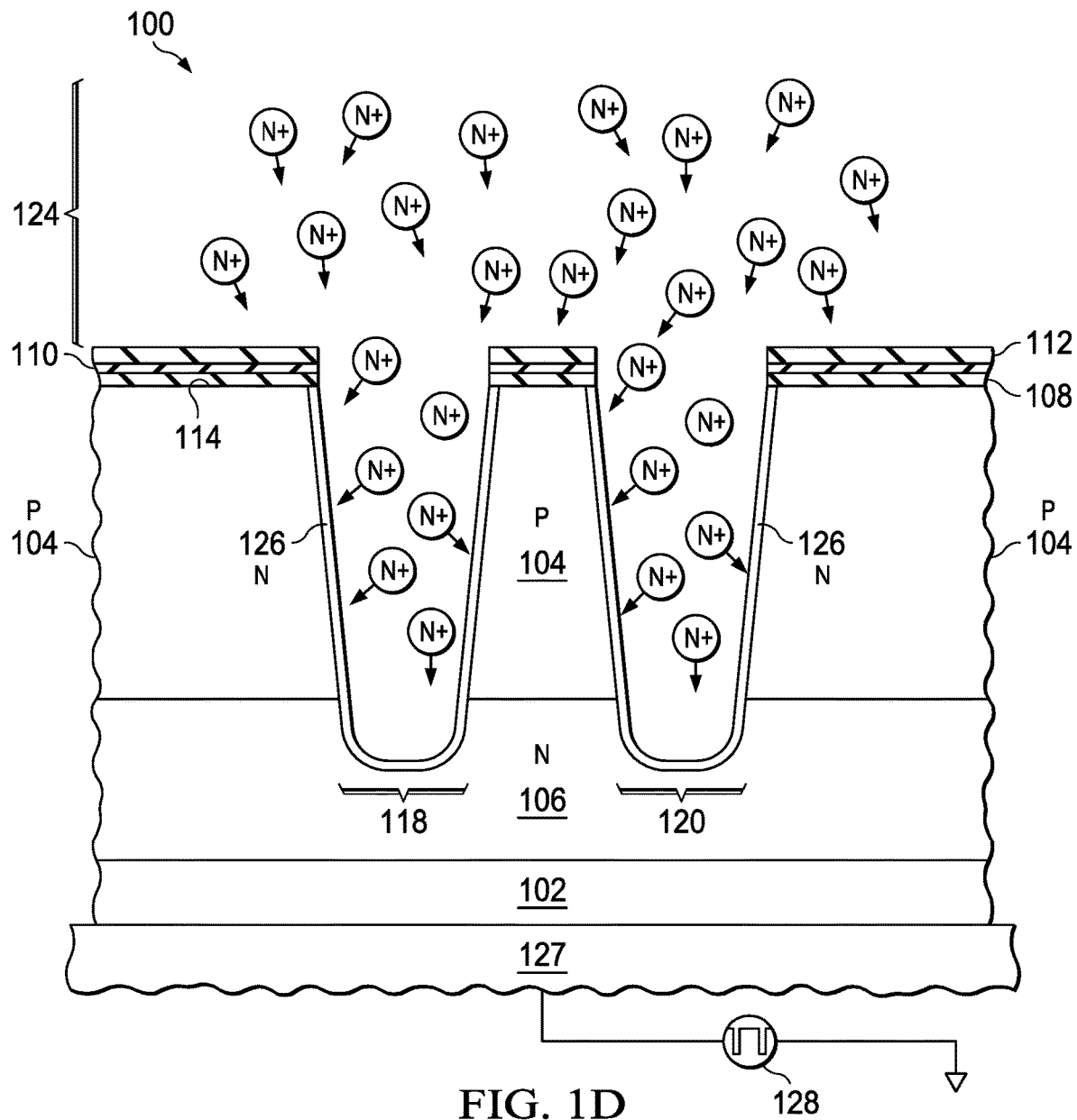
Figure 1E:
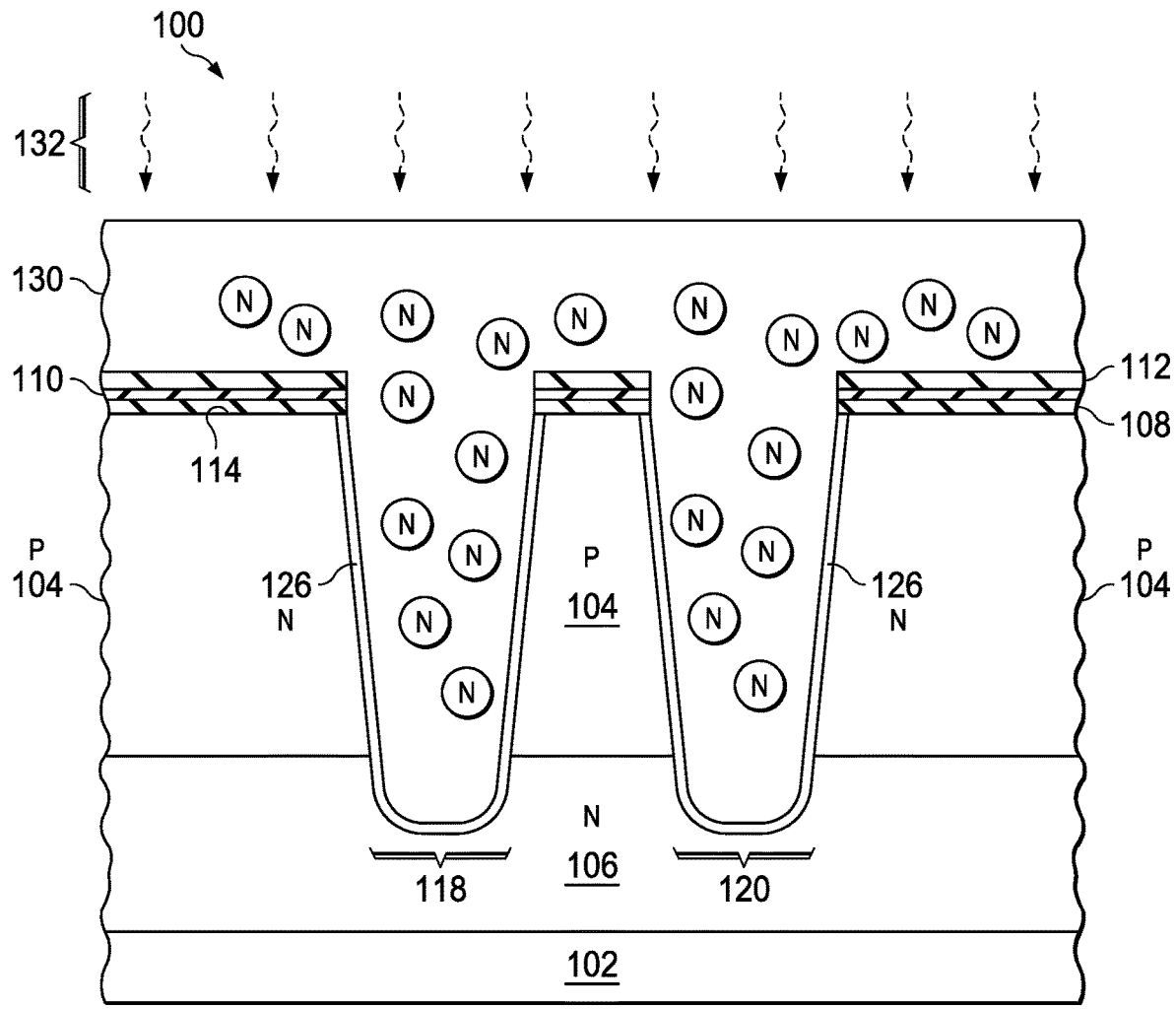

FIG. 1C through FIG. 1E depict three alternative processes for introducing dopants of the first conductivity type dopant (e.g. group-V element), n-type dopants 124 in this example, into the semiconductor layer 104 of the sidewalls of the first deep trench 118 and the second deep trench 120 to create a doped region in the first deep trench 118 and the second deep trench 120 sidewalls. Referring to FIG. 1C, n-type dopants 124 may be implanted into the semiconductor layer 104 by an ion implant process into the sidewalls of the first deep trench 118 and the second deep trench 120 to form a doped trench liner 126 in the semiconductor layer 104 along the sidewalls of the first deep trench 118 and the second deep trench 120. The n-type dopants 124 may include phosphorus, to provide a desired diffusion of the n-type dopants 124 during a subsequent anneal process. The ion implant process may be an angled implant process in which the n-type dopants 124 may be implanted at one or more angles with respect the top surface 114, such as 15 degrees to 30 degrees from perpendicular to the top surface 114. The angled implant process may implant the n-type dopants 124 in 4 steps at 90 degree increments of twist angle to provide a more uniform distribution of the n-type dopants 124 in the doped trench liner 126. Implanting the n-type dopants 124 at an angle may advantageously increase a depth into the semiconductor layer 104 at which the n-type dopants 124 are implanted. The n-type dopants 124 are blocked from the semiconductor layer 104 at the top surface 114 away from the first deep trench 118 and the second deep trench 120 by the hard mask layer 112 and the silicon nitride cap layer 110. The n-type dopants 124 may be implanted at a dose of $1 \times 10^{12}$ cm$^{-2}$ to $5 \times 10^{15}$ cm$^{-2}$, by way of example. The doped trench liner 126 may extend below bottoms of the first deep trench 118 and the second deep trench 120 into the NBL layer 106, as depicted in FIG. 1C. Alternatively, the doped trench liner 126 may terminate above the bottoms of the first deep trench 118 and the second deep trench 120, particularly in cases of the first deep trench 118 and the second deep trench 120 with high aspect ratios, that is, depth-to-width ratios above 5. Forming the doped trench liner 126 using the ion implant process may advantageously provide a desired dose amount of the n-type dopants 124 with lower fabrication cost and complexity compared to other methods, especially for fabrication facilities lacking other means for forming the doped trench liner 126.

Referring to FIG. 1D, the n-type dopants 124 may be introduced into the semiconductor layer 104 by a plasma immersion ion implantation process at the sidewalls of the first deep trench 118 and the second deep trench 120 to form the doped trench liner 126 in the semiconductor layer 104 along the sidewalls and bottoms of the first deep trench 118 and the second deep trench 120. The plasma immersion ion implantation process produces the n-type dopants 124 in the form of positive ions, by forming a plasma using a dopant reagent gas, such as phosphene. A negative bias potential is applied to the substrate 102 with respect to the n-type dopants 124, causing the n-type dopants 124 to accelerated toward the substrate 102 and become implanted into the semiconductor layer 104 along the sidewalls and bottoms of the first deep trench 118 and the second deep trench 120. The negative bias potential may be applied to the substrate 102 by placing the substrate 102 on a wafer chuck 127 and applying the negative bias potential using a pulsed voltage source 128. The pulsed voltage source 128 may be implemented to provides negative bias pulses, to implant the n-type dopants 124 more uniformly along the sidewalls and bottoms of the first deep trench 118 and the second deep trench 120. Between the negative bias pulses, the n-type dopants 124 may diffuse into the first deep trench 118 and the second deep trench 120 from the plasma to replace the n-type dopants 124 which were implanted by the previous negative bias pulse. Forming the doped trench liner 126 using the plasma immersion ion implantation process may advantageously provide a more uniform distribution of the n-type dopants 124 in the doped trench liner 126 than other methods, especially for cases of the first deep trench 118 and the second deep trench 120 with high aspect ratios.

Referring to FIG. 1E, the n-type dopants 124 may be introduced into the semiconductor layer 104 by forming a doped oxide layer 130 that includes the n-type dopants 124 over the semiconductor layer 104 and extending into the first deep trench 118 and the second deep trench 120, contacting the semiconductor layer 104. The doped oxide layer 130 may include silicon dioxide or a silicon dioxide-base material, such as a partially hydrogenated silicon dioxide material. The doped oxide layer 130 may be formed by a spin-on process using methyl silsesquioxane (MSQ) or hydrogen silsesquioxane (HSQ), with phosphorus. Alternatively, the doped oxide layer 130 may be formed by a CVD or PECVD process using dichlorosilane, oxygen, or tetraethoxy silane (TEOS), also referred to as tetraethyl orthosilicate, and phosphene to provide the n-type dopants 124. The n-type dopants 124 may be present in the doped oxide layer 130 at an average concentration above $10^{20}$ cm$^{-3}$.

Following formation of the doped oxide layer 130, the substrate 102 is heated by a thermal process 132 to a temperature of 800° C. to 1000° C. for 10 seconds to 100 seconds, causing a portion of the n-type dopants 124 to diffuse from the doped oxide layer 130 into the semiconductor layer 104 along the sidewalls and bottoms of the first deep trench 118 and the second deep trench 120, to form the doped trench liner 126. The thermal process 132 may be implemented using a rapid thermal processor (RTP) tool, by way of example. Increasing the temperature of the substrate 102 and increasing the time the substrate 102 is heated may increase the portion of the n-type dopants 124 that are transferred from the doped oxide layer 130 into the doped trench liner 126. The doped oxide layer 130 may be removed, prior to performing additional fabrication steps. The doped oxide layer 130 may be removed using a dilute buffered aqueous solution of hydrofluoric acid, for example.

Figure 1F:
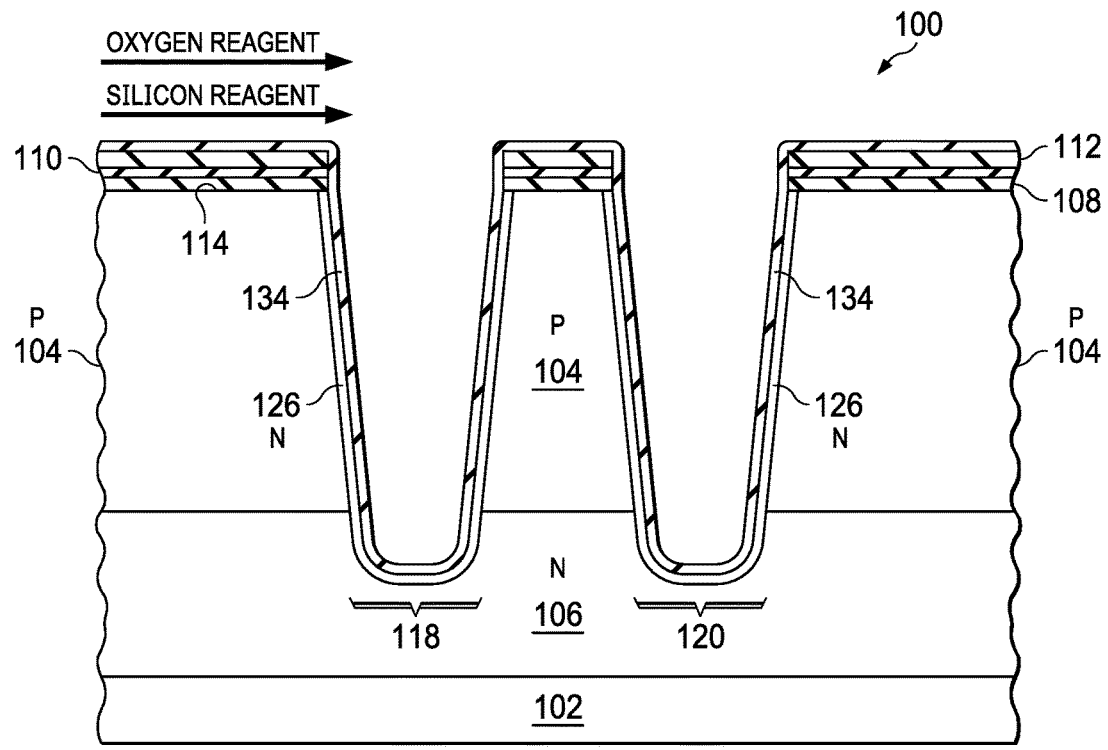

Referring to FIG. 1F, the deep trench dielectric liner 134 may be deposited onto the surfaces of the semiconductor layer 104. The deep trench dielectric liner 134 may be formed by a CVD or PECVD process using a silicon-containing reagent, such as silane, TEOS, or dichlorosilane, labeled "SILICON REAGENT" in FIG. 1F, and an oxygen-containing reagent, such as oxygen, TEOS, nitrous oxide, or ozone, labeled "OXYGEN REAGENT" in FIG. 1F. In one implementation, the CVD process may include a sub atmospheric chemical vapor deposition (SACVD) process. Formation of the deep trench dielectric liner 134 may be followed by a trench dielectric etch process to achieve a uniform thickness of the deep trench dielectric liner 134 along the sidewalls of the first deep trench 118 and the second deep trench 120. In an alternate version of this example, the deep trench dielectric liner 134 may include silicon dioxide formed by a thermal oxidation process. The deep trench dielectric liner 134 may have a thickness of 20 nanometers to 200 nanometers, by way of example.

Figure 1G:
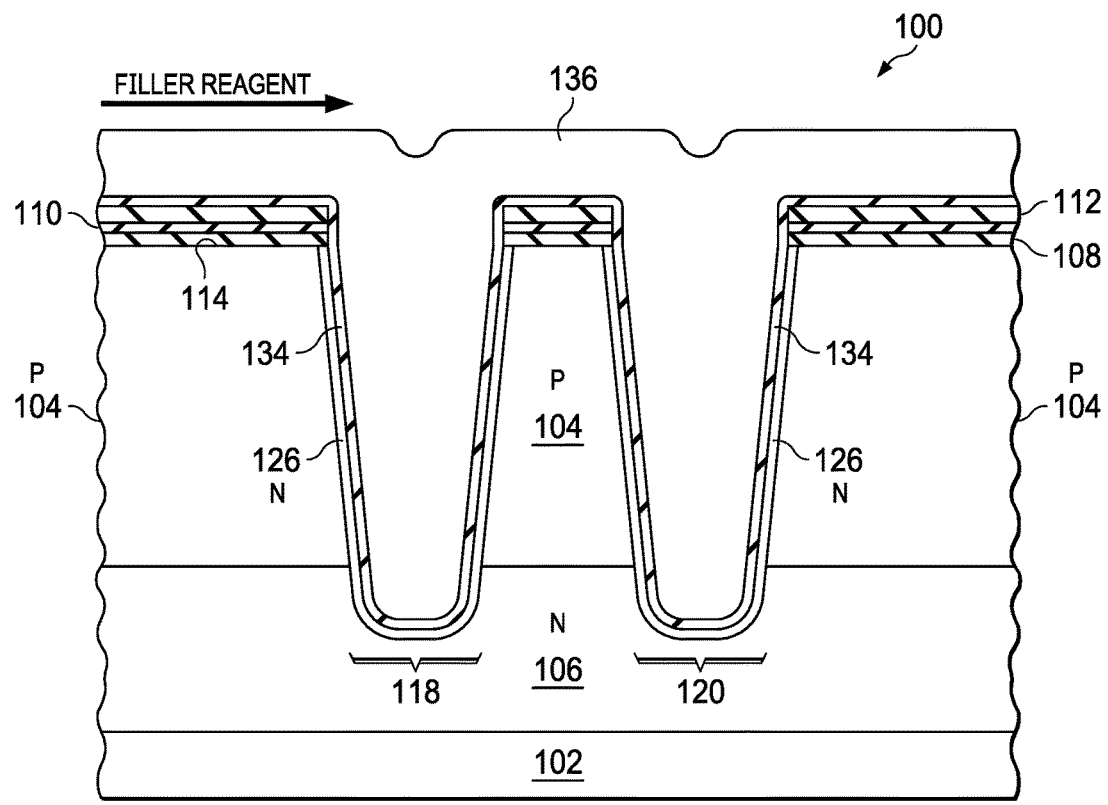

Referring to FIG. 1G, a deep trench filler material 136 is formed in the first deep trench 118 and the second deep trench 120. The deep trench filler material 136 may be formed by a CVD process using a filler reagent gas, labeled "FILLER REAGENT" in FIG. 1G. Polycrystalline silicon in the deep trench filler material 136 may be formed by a CVD process in which the filler reagent gas is implemented as silane or disilane. The deep trench filler material 136 is electrically conductive and fills the first deep trench 118 and the second deep trench 120, and may extend over the top surface 114 of the semiconductor layer 104 adjacent to the first deep trench 118 and the second deep trench 120.

Figure 1H:
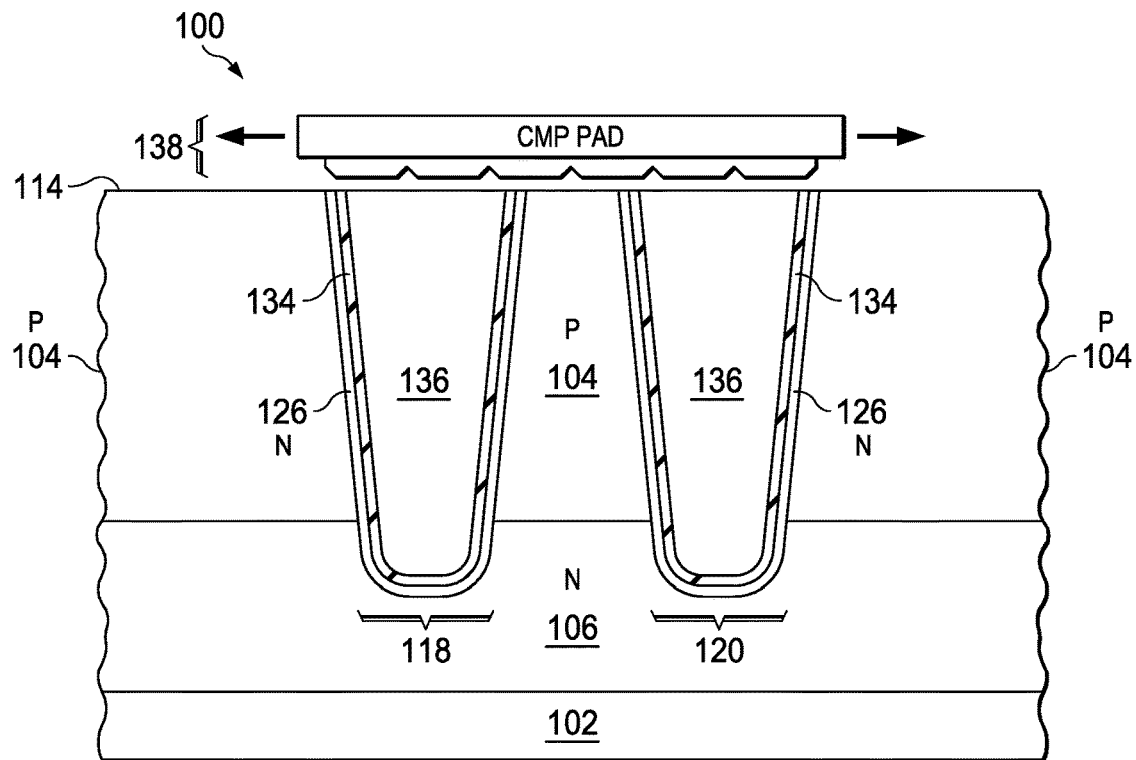

Referring to FIG. 1H, after the deep trench filler material 136 is formed, material of the deep trench filler material 136 outside of the first deep trench 118 and the second deep trench 120 is removed by a planarization process 138, leaving the deep trench filler material 136 within the first deep trench 118 and the second deep trench 120. The planarization process 138 may be implemented as a chemical mechanical polish (CMP) process, as indicated in FIG. 1H, or an etch back process, by way of example. The planarization process 138 may remove a portion, or all, of the pad oxide layer 108, the silicon nitride cap layer 110, and the hard mask layer 112, of FIG. 1G.

Figure 1I:
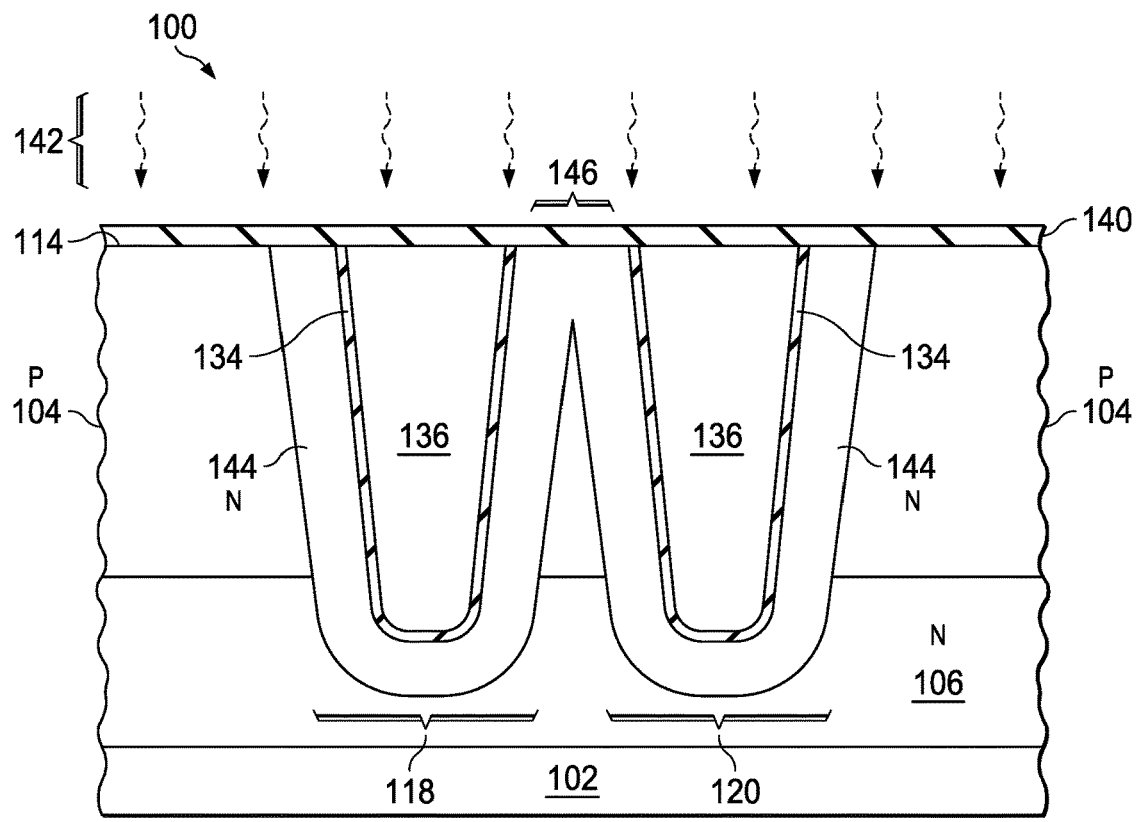

Referring to FIG. 1I, after the planarization process of FIG. 1H is completed, a diffusion cap layer 140 may be formed over the semiconductor layer 104. The diffusion cap layer 140 may include one or more sublayers of silicon dioxide and silicon nitride. The diffusion cap layer 140 may be formed by a thermal oxidation process followed by an LPCVD process. Heating the substrate 102 using a thermal anneal process 142 diffuses and activates the n-type dopants 124 of FIG. 1C through FIG. 1E in the doped trench liner 126 of FIG. 1H to form the doped sheath 144. The doped sheath 144 of the first deep trench 118 and the second deep trench 120 merge to form a continuous doped region in the first deep trench to second deep trench space 146 horizontally and the doped sheath 144 extends from the NBL layer 106 to the top surface 114 of the semiconductor layer 104 in the vertical direction. The thermal anneal process 142 may be implemented as a furnace anneal process, at a temperature range of 900° C. to 1100° C., and a time of 1 hour to 20 hours, by way of example. The doped sheath 144 may laterally extend up to 6 microns away from the first deep trench 118 and the second deep trench 120. The diffusion cap layer 140 may advantageously reduce loss of the n-type dopants 124 from the semiconductor layer 104 during the thermal anneal process 142.

Figure 1J:
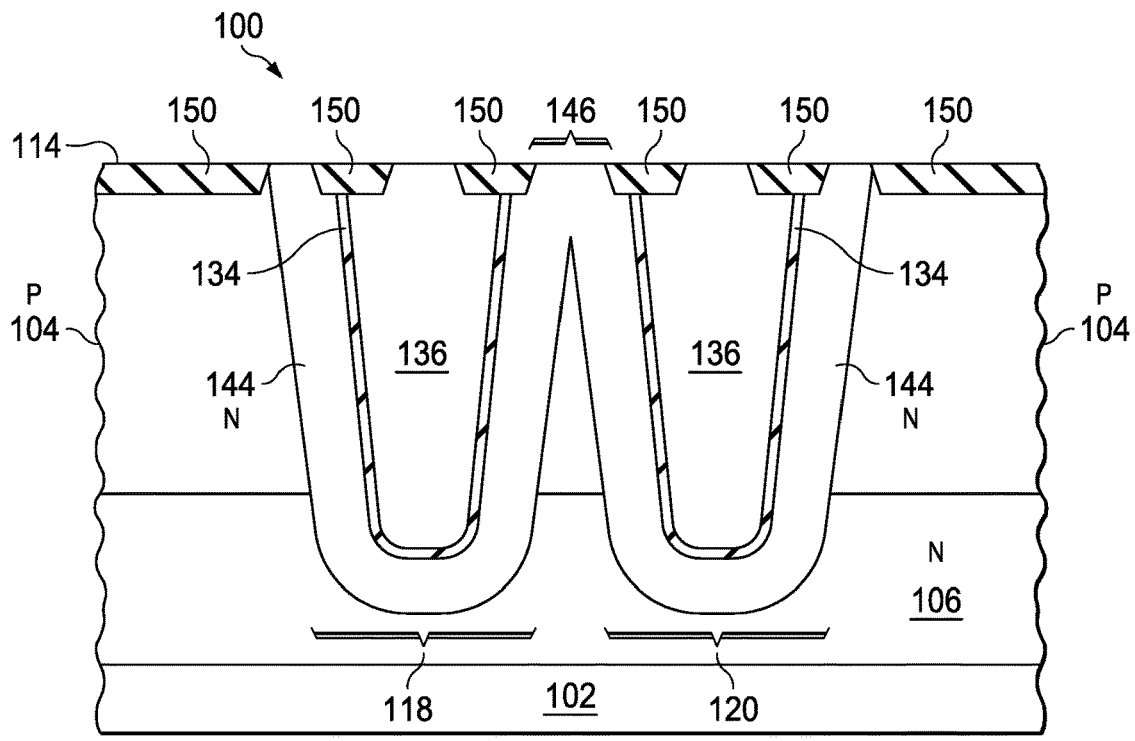

Referring to FIG. 1J, a pattern and etch step (not specifically shown) define regions of shallow trench isolation (STI) 150 between the doped sheath 144 and the deep trench filler material 136, and isolates other elements of the semiconductor device 100. After the STI 150 regions are defined, a silicon dioxide filler material is formed over the top surface 114. The silicon dioxide filler material of the STI 150 above the top surface 114 is removed by a planarization process (not specifically shown), forming the STI 150. The planarization process (not specifically shown) may be implemented as a chemical mechanical polish (CMP) process, as indicated in FIG. 1H, or an etch back process, by way of example.

Figure 1K:
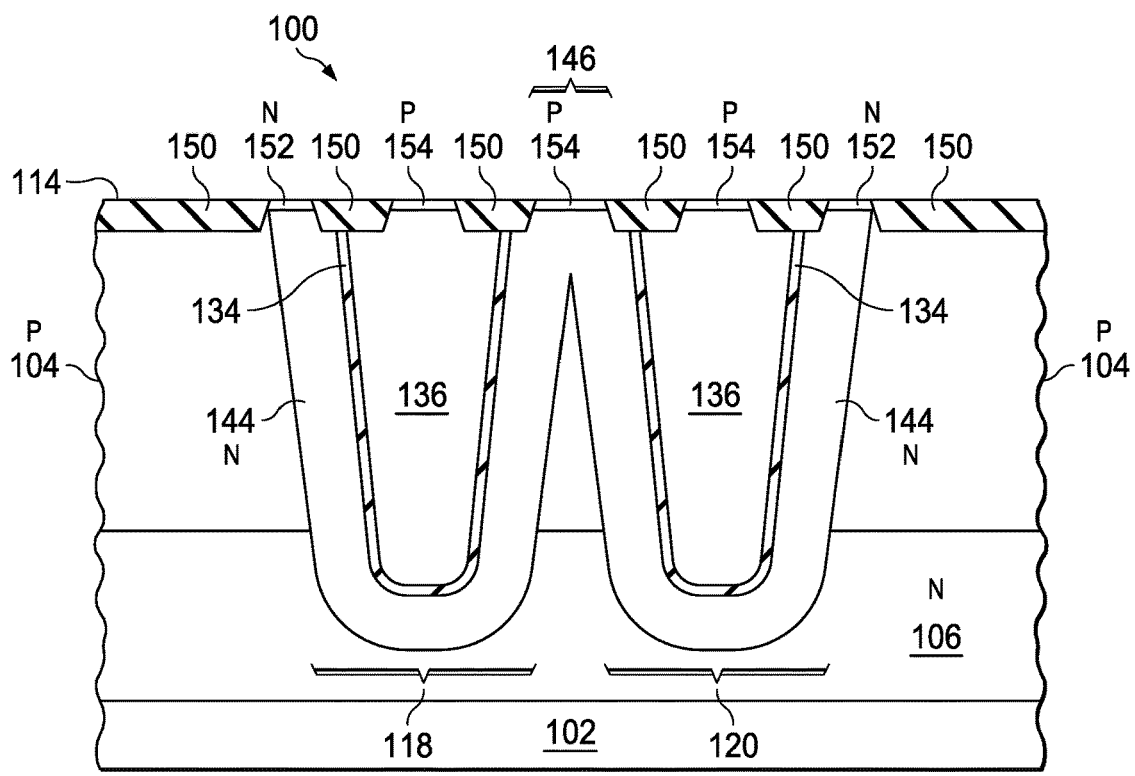

Referring to FIG. 1K the semiconductor device 100 is shown after the formation of implants of the first conductivity type dopant 152 and implants of the second conductivity type dopant 154 in the example method which occur during the source and drain implant formation processes. In this example, the source implant is of the first conductivity type dopant 152 is an n-type implant and may have a dopant concentration of $5 \times 10^{19}$ atoms/cm$^3$ to $5 \times 10^{20}$ atoms/cm$^3$, by way of example. The drain implant is of the second conductivity type dopant 154 (e.g. group-III element), is a p-type implant and may have a dopant concentration of $5 \times 10^{15}$ atoms/cm$^3$ to $5 \times 10^{16}$ atoms/cm$^3$, by way of example. The formation of the first conductivity type dopant 152 and implants of the second conductivity type dopant 154 is made by a series of pattern and ion implant steps (not specifically shown).

Figure 1L:
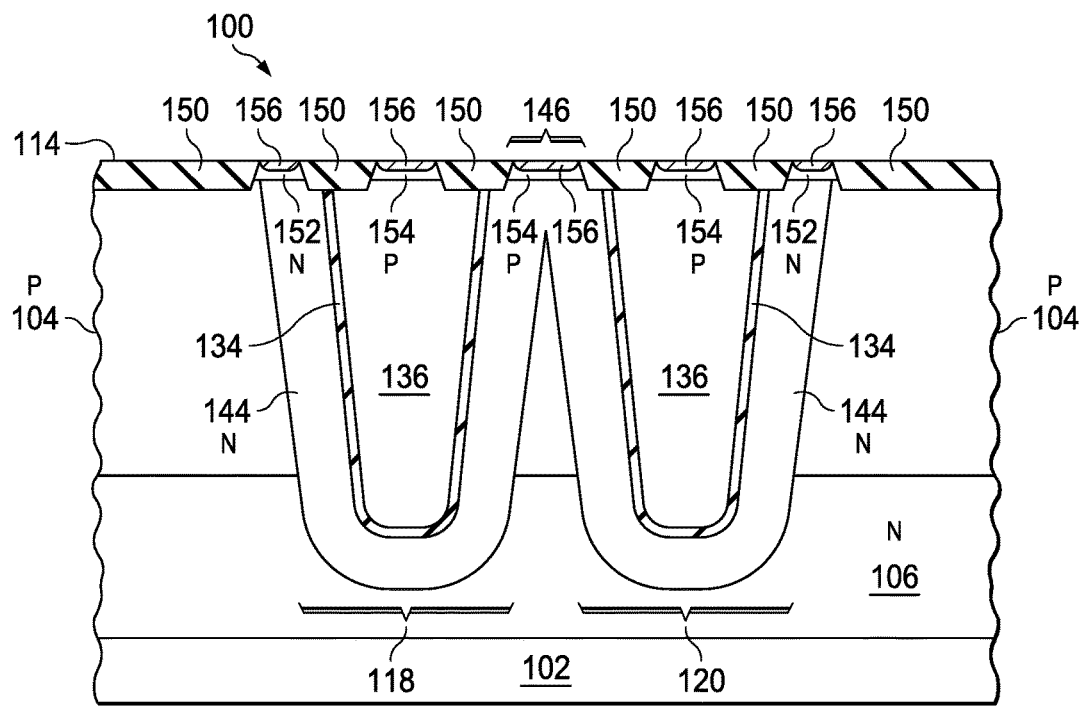

FIG. 1L shows the semiconductor device 100 after the formation of a metal silicide layer 156. To form the metal silicide layer 156, a metal layer (not specifically shown) is formed over the top surface 114. The metal layer may include titanium, cobalt, nickel, or platinum, or a combination thereof, by way of example. The metal layer may be 10 nanometers to 100 nanometers thick, by way of example. The metal layer is heated by a radiant process (not specifically shown) causing the metal layer to react with the top surface 114 of semiconductor layer 104 to form a metal silicide layer 156 while metal covering the STI 150 regions remains unreacted. After the metal silicide layer 156 is formed, the unreacted metal is removed by a wet etch process using an aqueous mixture of nitric acid, hydrochloric acid, sulfuric acid or hydrofluoric acid, or a combination of these acids.

Figure 1M:
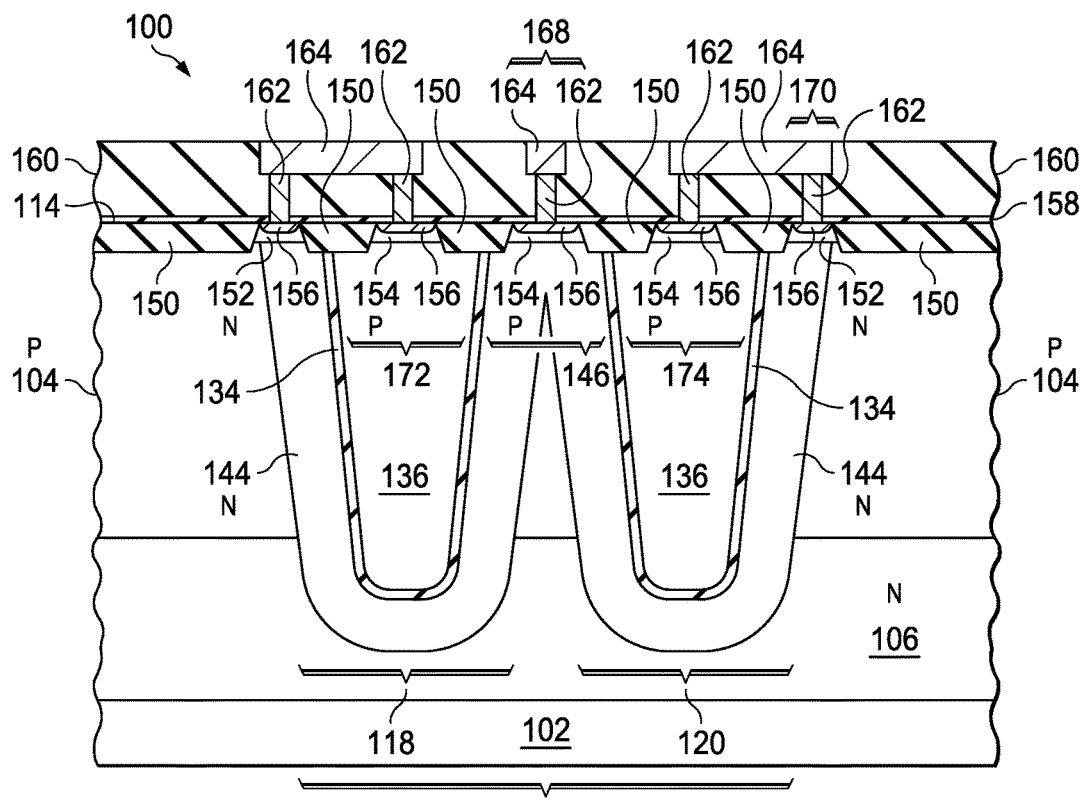

FIG. 1M, shows the semiconductor device 100 consisting of a Zener diode 166 with a doped region of a second conductivity type dopant 154 contacting the doped sheath 144 between the first deep trench 118 and the second deep trench 120 providing an anode 168 of the Zener diode 166. The cathode 170 is also shown in FIG. 1M. As depicted in FIG. 1M, the anode 168 abuts the deep trench, but can also be configured where the first deep trench 118 and the second deep trench 120 are laterally separated from the anode 168. The additional processing to complete the Zener diode includes the formation of the contact etch stop layer 158, formation of a pre-metal dielectric (PMD) layer 160, formation of contacts 162 to the top surface 114, and formation of the first level of metallization 164. The first deep trench 118 has a first width 172 and a first length (out of the plane of FIG. 1M). The first width 172 can be equal to less than the first length. The second deep trench 120 has a second width 174 and the second length (out of the plane of FIG. 1M). The second width 174 can be equal to or less than the second length.

As device geometries shrink, the dopant dose of the deep n-well implant generally goes down which results in higher Zener diode breakdown voltage in devices that rely on the deep n-well implant dose to set the Zener diode breakdown voltage. Higher Zener diode breakdown is undesirable in many applications. This has resulted in a requirement in many cases of a separate Zener diode pattern and implant step to achieve a desired breakdown voltage which increases fabrication cost. The current embodiment allows a layout based solution to tailor the Zener diode breakdown voltage to the application requirements without adding a specific Zener diode implant. A key advantage of the semiconductor device 100 is that it requires no extra processes if deep trenches are required in other components of the semiconductor device 100. A second key advantage of semiconductor device 100 is the small footprint of the Zener diode compared to other embodiments in the patent literature. A third advantage of the semiconductor device 100 is a layout based solution using two or more deep trenches which can tune the breakdown voltage of the Zener diode by adjusting the first deep trench 118 to second deep trench 120 spacing to modulate the deep n-well doping concentration between the first deep trench 118 and the second deep trench 120 and thus modulate the breakdown voltage.

Figure 2:
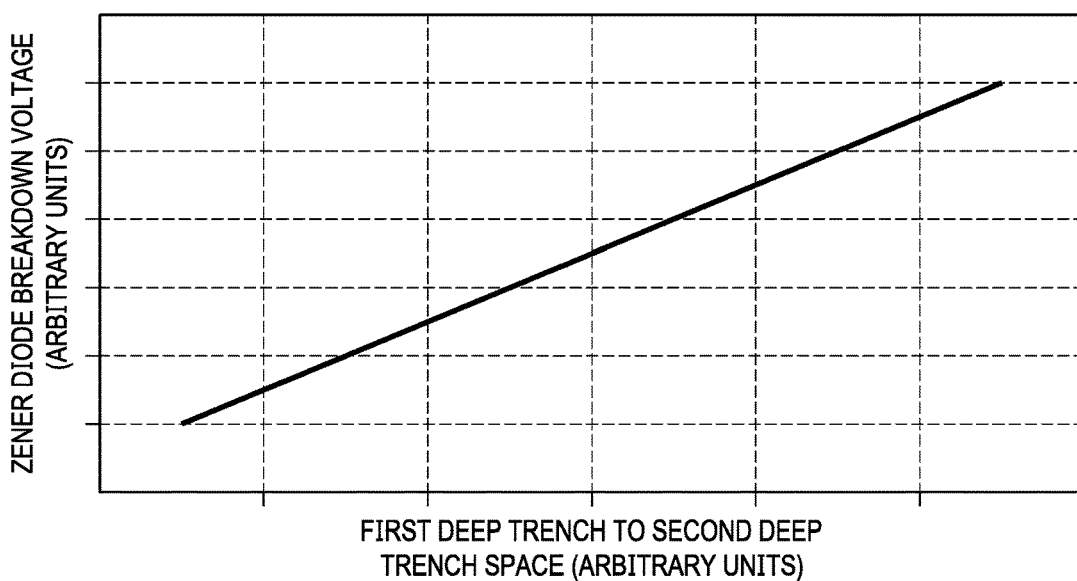
FIG. 2 includes a graph showing the relationship between the deep trench to deep trench space and the breakdown of the resulting Zener diode.

FIG. 2 shows the relationship between the first deep trench to second deep trench space 146 and the effect of the first deep trench to second deep trench space 146 on Zener breakdown voltage. As the first deep trench to second deep trench space 146 becomes smaller, the concentration of deep n-well dopant in the first deep trench to second deep trench space 146 becomes higher due to the increased overlap of the doped sheath 144 of the first deep trench 118 and the doped sheath 144 of the second deep trench 120. The first deep trench 118 and the second deep trench 120 can have a different width and length to form a linear trench, or can be configured with the same width and length to form an island.

Figure 3:
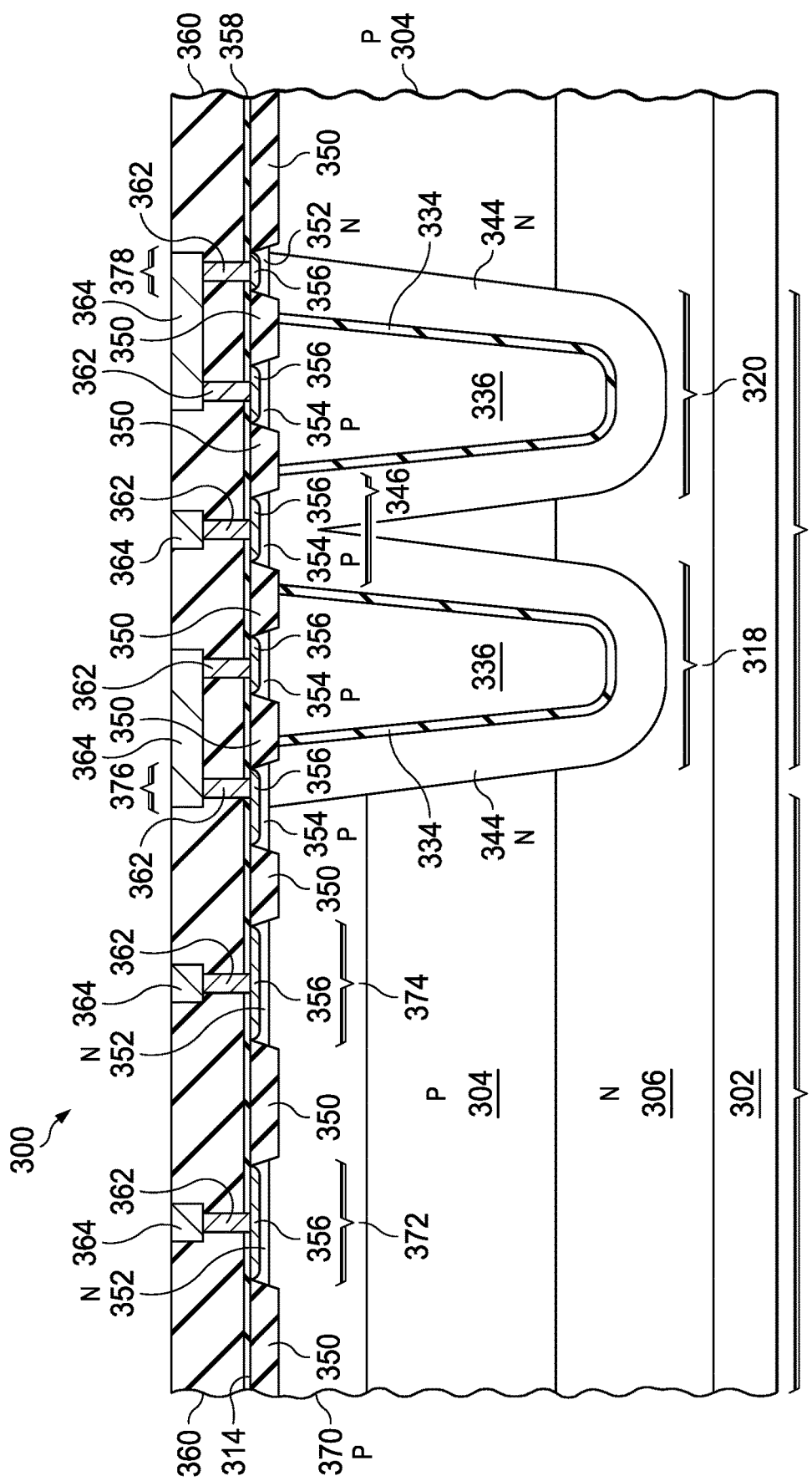
FIG. 3 includes a cross section of a deep trench Zener diode used as a triggering Zener diode for a bipolar transistor.

FIG. 3 depicts a cross section of a semiconductor device 300 which includes a Zener diode 366 of the type depicted in FIG. 1M and a bipolar device 368 where the Zener diode 366 is used as a trigger Zener diode 366 protection device. The Zener diode 366 is used to limit the voltage the bipolar device 368 and protect it from higher voltages. The bipolar device 368 is shown by way of example, though other semiconductor elements could be used with the Zener diode 366 in a similar manner. The Zener diode 366 can be used in a like manner to protect other semiconductor components from higher voltages. The bipolar device 368 contains a shallow P doped Well region (SPW) 370 which acts as a base for the bipolar transistor and is located under the emitter 372, and the collector 374 of the device. The anode 376 is connected to the base of the bipolar device 368, while the cathode 378 is located furthest from the bipolar device 368. The remainder of the components of the Zener diode 366 are formed in a manner similar as those in FIG. 1A-1M. The semiconductor device 300 contains a substrate 302, a semiconductor layer 304, an n-type buried layer NBL 306 with a top surface 314. The Zener diode 366 contains a first deep trench 318 and a second deep trench 320 with a trench liner 334 and a doped sheath 344 and a deep trench filler material 336. The first deep trench to second deep trench space 346 sets the voltage of the Zener diode 366 breakdown voltage. STI 350 provides isolation between components. The implant of the first doping type 352 and implant of the second doping type 354 provide source and drain regions for both Zener diode 366 and the bipolar device 368. A metal silicide layer 356, contact etch stop layer 358, PMD layer 360, contacts 362 and metallization 364 complete the semiconductor device 300.

Figure 4:
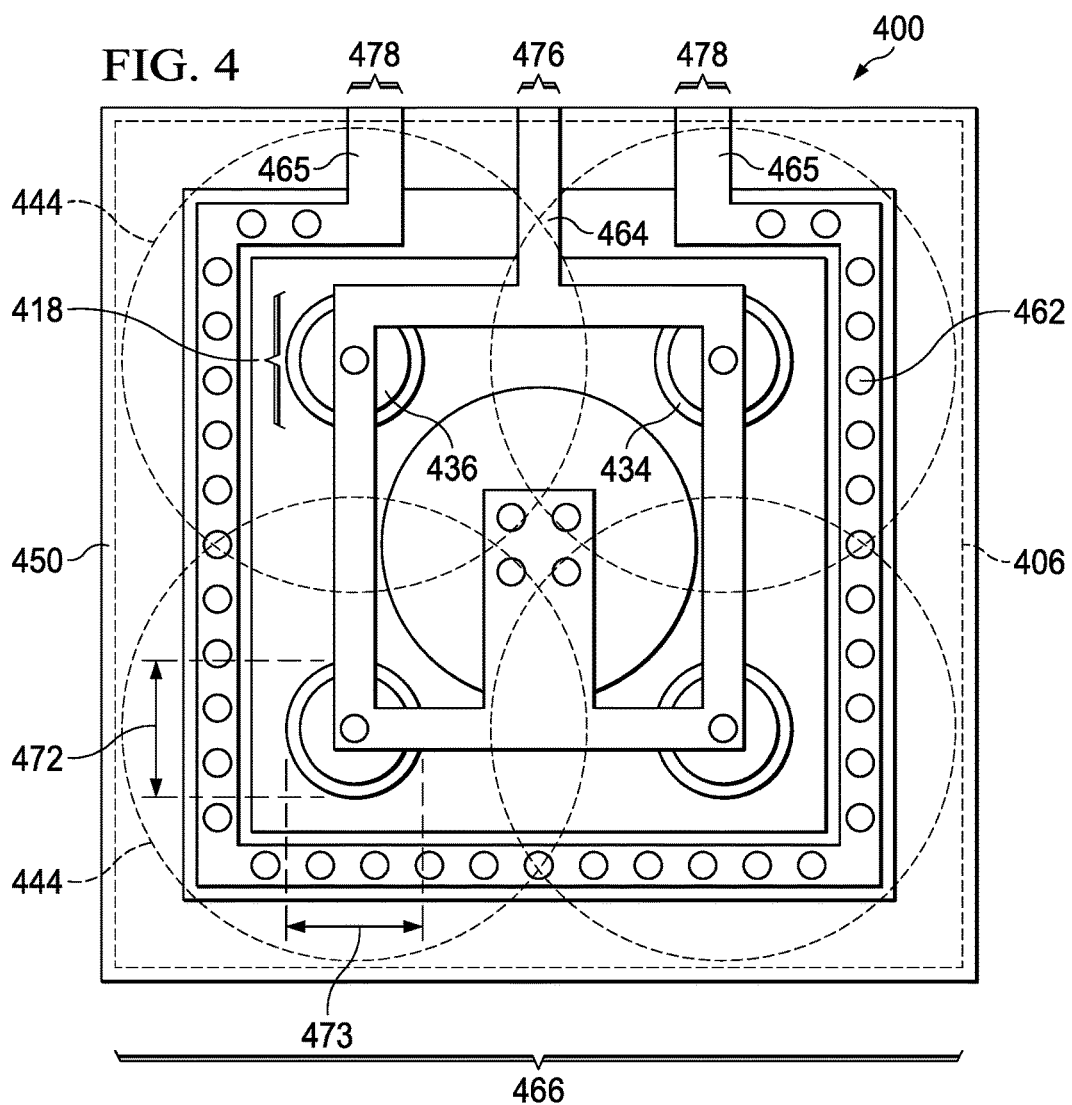
FIG. 4 is a top down view of a configuration of a deep trench Zener diode including a square array of four deep trenches surrounding the anode of the Zener diode and surrounded by the cathode of the Zener diode.

Referring to FIG. 4, a top down view of a semiconductor device 400 is shown containing a Zener diode 466. The Zener diode 466 is contained by NBL 406 with a central anode 476 and with a square array of four deep trenches 418, each which have a trench liner 434 and a trench filler material 436. Each of the four deep trenches 418 has a width 472 and a length 473. The width 472 may be equal to or less than the length 473 for each of the four deep trenches 418 in the semiconductor device 400. The deep trenches 418 are each surrounded by a doped sheath 444. The central anode 476 is surrounded by a square cathode 478. The central anode 476 of the Zener diode 466 is at the center and is connected to other elements of the semiconductor device 400 through one section of metallization 464, and the cathode 478 is located around the perimeter of the square is connected to other elements of the semiconductor device 400 through a second section of metallization 465. STI 450 provides isolation between components. Contacts 462 make contact with the central anode 476 and the cathode 478 and metallization 464 and metallization 465.

Figure 5:
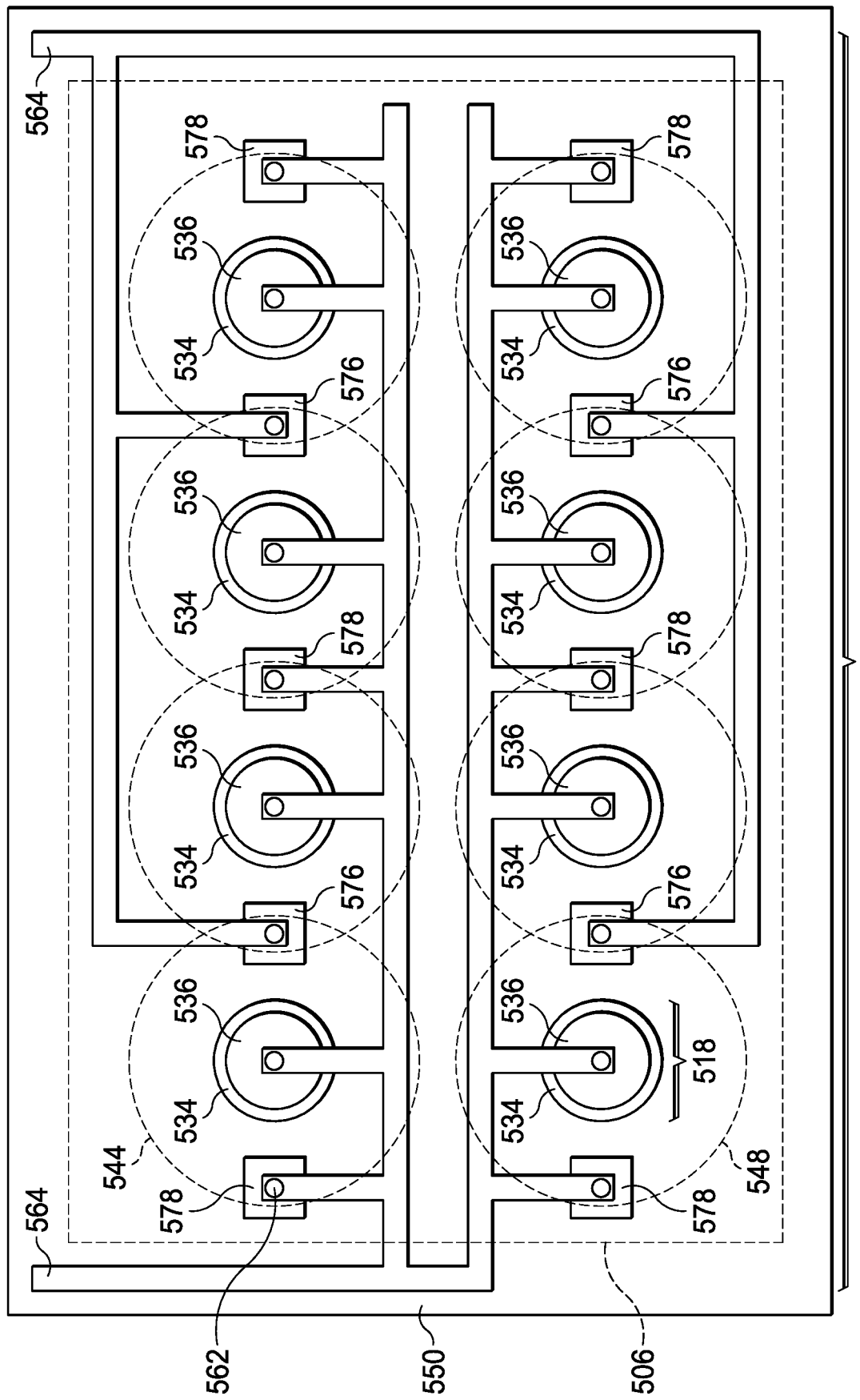
FIG. 5 is a top down view of an array of eight deep trenches used as a Zener diode.

Referring to FIG. 5, a top down view of a semiconductor device 500 with an alternate configuration of a deep trench Zener diode 566 is shown. In the configuration shown, an array of deep trenches 518 shown. The array consists of at least two anodes 576, at least two cathodes 578, and at least three deep trenches 518, and can be expanded to a larger array of deep trenches 518 depending on the application. The deep trench filler material 536 is surrounded by the trench liner 534. The cathode 578 and anode 576, are placed between the deep trenches 518. Contacts 562 and metallization 564 connect the Zener diode 566 to external circuitry. A region of NBL 506 surrounds the deep trench Zener diode 566 array. STI 550 provides isolation the cathode 578, anode 576. The deep trench Zener diode 566 is connected to external circuitry through contacts 562 and metallization 564.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
   a substrate including a semiconductor layer;
   a first trench and a second trench in the semiconductor layer;
   a doped sheath of a first conductivity type contacting and laterally surrounding the first trench and the second trench, the doped sheath being continuous between the first trench and the second trench, wherein the doped sheath includes a first portion contacting the first trench, a second portion contacting the second trench, and a third portion between the first and second portions, the third portion having a doping concentration greater than the first and second portions;
   a doped region of the first conductivity type contacting the first or second portion of the doped sheath providing a cathode of a diode; and a doped region of a second conductivity type contacting the third portion of the doped sheath between the first trench and the second trench providing an anode of the diode.

2. The semiconductor device of claim 1, wherein the first conductivity type is n-type and the second conductivity type is p-type.

3. The semiconductor device of claim 1, wherein the first trench has a first length and a first width less than the first length, and the second trench has a second length and a second width less than the second length.

4. The semiconductor device of claim 1, wherein the first trench has a first length and a first width that are equal, and the second trench has a second length and a second width that are equal.

5. The semiconductor device of claim 1, further comprising:
a third trench disposed between the anode and the cathode, wherein the third trench has a depth less than the first or second trench.

6. The semiconductor device of claim 1, wherein the diode is configured to protect other semiconductor components of the semiconductor device from voltages greater than a breakdown voltage of the diode.

7. The semiconductor device of claim 1, wherein the diode is configured to trigger a bipolar transistor of the semiconductor device.

8. The semiconductor device of claim 1, wherein the anode is surrounded by an array of trenches including the first and second trenches.

9. The semiconductor device of claim 1, wherein:
the anode is a first anode;
the cathode is a first cathode; and
the diode includes a second anode, a second cathode, and a third trench.

10. The semiconductor device of claim 1, wherein the anode is laterally separated from the first trench and the second trench.

11. The semiconductor device of claim 1, further comprising:
a dielectric layer in the first and second trenches, the dielectric layer abutting the doped sheath, wherein the dielectric layer is continuous between a first end of the first or second trench intersecting a surface of the semiconductor layer and a second end of the first or second trench intersecting the surface.

12. The semiconductor device of claim 11, further comprising:
a polysilicon core on the dielectric layer, the polysilicon core filling the first or second trench.

13. The semiconductor device of claim 1, wherein the doped sheath is continuous between a first end of the first or second trench intersecting a surface of the semiconductor layer and a second end of the first or second trench intersecting the surface.

14. A semiconductor device, comprising:
a substrate;
a first trench in the substrate;
a first doped layer of a first conductivity type surrounding the first trench;
a second trench in the substrate, the second trench laterally spaced apart from the first trench;
a second doped layer of the first conductivity type surrounding the second trench, wherein the first doped layer overlaps with the second doped layer forming a first doped region with a doping concentration greater than the first doped layer and the second doped layer; and
a second doped region of a second conductivity type opposite the first conductivity type abutting the first doped region to form a junction at an interface between the first doped region and the second doped region.

15. The semiconductor device of claim 14, wherein the second doped region abutting the first doped region forms a Zener diode.

16. The semiconductor device of claim 14, further comprising:
a third doped region of the first conductivity type abutting the first doped layer, wherein:
the first doped region and the second doped region are located on a first side of the first trench facing toward the second trench; and
the third doped region is located on a second side of the first trench facing away from the second trench.

17. The semiconductor device of claim 16, wherein:
the second doped region provides a first terminal of a diode including the first doped region and the second doped region; and
the third doped region provides a second terminal of the diode.

18. The semiconductor device of claim 14, wherein the first doped layer is continuous along an interface between the first trench and the substrate.

19. The semiconductor device of claim 14, wherein:
the first doped layer has a first doping concentration;
the second doped layer has a second doping concentration; and
the doping concentration of the first doped region corresponds to a sum of the first and second doping concentration.

20. The semiconductor device of claim 14, wherein:
the first conductivity type is n-type; and
the second conductivity type is p-type.

21. The semiconductor device of claim 14, wherein:
the first conductivity type is p-type; and
the second conductivity type is n-type.

* * * * *